(12) United States Patent
Reisner et al.

(10) Patent No.: US 11,996,822 B2
(45) Date of Patent: May 28, 2024

(54) WIDE BANDWIDTH TIME DIVISION DUPLEX TRANSCEIVER

(71) Applicant: MURATA MANUFACTURING CO., LTD, Kyoto (JP)

(72) Inventors: Russ Reisner, Oxnard, CA (US); Neal Fenzi, Santa Barbara, CA (US); Robert B. Hammond, Santa Barbara, CA (US); Patrick Turner, San Bruno, CA (US); Bryant Garcia, Burlingame, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 754 days.

(21) Appl. No.: 17/108,977

(22) Filed: Dec. 1, 2020

(65) Prior Publication Data
US 2021/0119603 A1    Apr. 22, 2021

Related U.S. Application Data

(63) Continuation-in-part of application No. 16/829,617, filed on Mar. 25, 2020, now Pat. No. 10,868,512,
(Continued)

(51) Int. Cl.
*H03H 9/17* (2006.01)
*H03H 9/02* (2006.01)
(Continued)

(52) U.S. Cl.
CPC .............. *H03H 9/171* (2013.01); *H03H 9/02* (2013.01); *H03H 9/54* (2013.01); *H03H 9/02015* (2013.01); *H03H 9/13* (2013.01)

(58) Field of Classification Search
CPC ............ H03H 9/171; H03H 9/02; H03H 9/54; H03H 9/02015; H03H 9/13
(Continued)

(56) References Cited

U.S. PATENT DOCUMENTS

| 5,446,330 A | 8/1995 | Eda et al. |
| 5,552,655 A | 9/1996 | Stokes et al. |

(Continued)

FOREIGN PATENT DOCUMENTS

| CN | 106788318 A | * | 5/2017 | ............... H03H 3/02 |
| CN | 106788318 A | | 5/2017 | |

(Continued)

OTHER PUBLICATIONS

Xue, Yanmei et. al., "High Q Lateral-Field-Excited Bulk Resonator Based on Single-Crystal LiTaO3 for 5G Wireless Communication", Journal of Electron devices society, Mar. 2021 (Year: 2021).*
(Continued)

*Primary Examiner* — Hafizur Rahman
(74) *Attorney, Agent, or Firm* — ARENTFOX SCHIFF LLP

(57) ABSTRACT

A wide bandwidth time division duplex (TDD) transceiver includes a transmitter, a receiver, and a bandpass filter implemented with a plurality of acoustic resonators including at least one shunt resonator and at least one series resonator. A transmit/receive switch is configured to selectively connect a first terminal of the bandpass filter to either an output of the transmitter or an input of the receiver. Each of the plurality of acoustic resonators is a high power transversely-excite film bulk acoustic resonator.

16 Claims, 6 Drawing Sheets

Related U.S. Application Data which is a continuation of application No. 16/578,811, filed on Sep. 23, 2019, now Pat. No. 10,637,438, which is a continuation-in-part of application No. 16/230,443, filed on Dec. 21, 2018, now Pat. No. 10,491,192.

(60) Provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/54* (2006.01)
*H03H 9/13* (2006.01)

(58) Field of Classification Search
USPC .................................................. 333/186
See application file for complete search history.

(56) References Cited

U.S. PATENT DOCUMENTS

| | | |
|---|---|---|
| 5,631,515 A | 5/1997 | Mineyoshi et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,939,987 B1 | 5/2011 | Solal et al. |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,112,134 B2 | 5/2015 | Takahashi |
| 9,093,979 B2 | 7/2015 | Wang |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,319 B1 | 10/2020 | Hyde |
| 10,826,462 B2 | 11/2020 | Plesski et al. |
| 10,868,510 B2 | 12/2020 | Yantchev |
| 10,868,512 B2 | 12/2020 | Garcia et al. |
| 10,917,070 B2 | 2/2021 | Plesski et al. |
| 10,985,728 B2 | 4/2021 | Plesski et al. |
| 11,146,232 B2 | 10/2021 | Yandrapalli et al. |
| 11,201,601 B2 | 12/2021 | Yantchev et al. |
| 11,418,167 B2 | 8/2022 | Garcia |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0099091 A1 | 5/2005 | Mishima et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0090898 A1 | 4/2007 | Kando |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0296304 A1 | 12/2007 | Fujii et al. |
| 2008/0018414 A1 | 1/2008 | Inoue et al. |
| 2008/0246559 A1 | 10/2008 | Ayazi |
| 2008/0297280 A1 | 12/2008 | Thalhammer et al. |
| 2009/0315640 A1 | 12/2009 | Umeda et al. |
| 2010/0064492 A1 | 3/2010 | Tanaka |
| 2010/0123367 A1 | 5/2010 | Tai et al. |
| 2010/0212127 A1 | 8/2010 | Heinze et al. |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto |
| 2011/0278993 A1 | 11/2011 | Iwamoto |
| 2012/0286900 A1 | 11/2012 | Kadota et al. |
| 2013/0057360 A1 | 3/2013 | Meltaus et al. |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0042417 A1 | 2/2015 | Onodera et al. |
| 2015/0244149 A1 | 8/2015 | Van Someren |
| 2015/0319537 A1 | 11/2015 | Perois et al. |
| 2015/0333730 A1 | 11/2015 | Meltaus |
| 2016/0028367 A1 | 1/2016 | Shealy |
| 2016/0049920 A1 | 2/2016 | Kishino |
| 2016/0079958 A1 | 3/2016 | Burak |
| 2016/0149554 A1 | 5/2016 | Nakagawa |
| 2016/0182009 A1 | 6/2016 | Bhattacharjee |
| 2016/0301382 A1 | 10/2016 | Iwamoto |
| 2017/0063332 A1 | 3/2017 | Gilbert et al. |

(56) References Cited

U.S. PATENT DOCUMENTS

| | | |
|---|---|---|
| 2017/0104470 A1 | 4/2017 | Koelle et al. |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0214389 A1 | 7/2017 | Tsutsumi |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0316333 A1 | 11/2018 | Nakamura et al. |
| 2018/0358948 A1 | 12/2018 | Gong et al. |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181825 A1 * | 6/2019 | Schmalzl ............... H03H 7/463 |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin |
| 2019/0348966 A1 | 11/2019 | Campanella-Pineda |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0244247 A1 | 7/2020 | Maeda |
| 2020/0295729 A1 | 9/2020 | Yantchev |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2020/0373907 A1 | 11/2020 | Garcia |
| 2021/0273631 A1 | 9/2021 | Jachowski et al. |
| 2021/0313951 A1 | 10/2021 | Yandrapalli et al. |
| 2021/0328575 A1 | 10/2021 | Hammond et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | | |
|---|---|---|---|
| CN | 110417373 A | * | 11/2019 |
| CN | 110417373 A | | 11/2019 |
| CN | 210431367 U | * | 4/2020 |
| CN | 113765495 A | | 12/2021 |
| JP | H10209804 A | | 8/1998 |
| JP | 2001244785 A | | 9/2001 |
| JP | 2002300003 A | | 10/2002 |
| JP | 2003078389 A | | 3/2003 |
| JP | 2004096677 A | | 3/2004 |
| JP | 2004129222 A | | 4/2004 |
| JP | 2004523179 A | | 7/2004 |
| JP | 2004304622 A | | 10/2004 |
| JP | 2006173557 A | | 6/2006 |
| JP | 2007251910 A | | 9/2007 |
| JP | 2007329584 A | | 12/2007 |
| JP | 2010062816 A | | 3/2010 |
| JP | 2010103803 A | | 5/2010 |
| JP | 2010154505 A | | 7/2010 |
| JP | 2010233210 A | | 10/2010 |
| JP | 2013528996 A | | 7/2013 |
| JP | 2013214954 A | | 10/2013 |
| JP | 2015054986 A | | 3/2015 |
| JP | 2016001923 A | | 1/2016 |
| JP | 2017526254 A | | 9/2017 |
| JP | 2017220910 A | | 12/2017 |
| JP | 2018093487 A | | 6/2018 |
| JP | 2018166259 A | | 10/2018 |
| JP | 2018207144 A | | 12/2018 |
| JP | 2019186655 A | | 10/2019 |
| JP | 2020113939 A | | 7/2020 |
| WO | 2010047114 A1 | | 4/2010 |
| WO | 2013021948 A1 | | 2/2013 |
| WO | 2015098694 A1 | | 7/2015 |
| WO | 2016017104 | | 2/2016 |
| WO | 2016052129 A1 | | 4/2016 |
| WO | 2016147687 A1 | | 9/2016 |
| WO | 2017188342 A1 | | 11/2017 |
| WO | 2018003268 A1 | | 1/2018 |
| WO | 2018003273 A1 | | 1/2018 |
| WO | 2018163860 A1 | | 9/2018 |
| WO | 2019117133 A1 | | 6/2019 |
| WO | 2019138810 A1 | | 7/2019 |
| WO | 2020092414 A2 | | 5/2020 |
| WO | 2020100744 A1 | | 5/2020 |

OTHER PUBLICATIONS

Gorisse, M. et. al., "Lateral Field Excitation of membrane-based Aluminum Nitride resonators", 2011 Joint Conference of the IEEE International Frequency Control and the European Frequency and Time Forum (FCS) Proceedings (Year: 2011).*

Pang, Wei et. al., "Self-Aligned Lateral Field Excitation Film Acoustic Resonator with Very Large Electromechanical Coupling", 2004 IEEE International Ultrasonics, Ferroelectrics and Frequency Control Joint 50th Anniversary Conference, pp. 558-561 (Year: 2004).*

Yandrapalli, Soumya et. al., "Toward Band n78 Shear Bulk Acoustic Resonators Using Crystalline Y-Cut Lithium Niobate Films with Spurious Suppression", Journal of Microelectromechanical Systems, vol. 32, No. 4, Aug. 2023, pp. 327-334 (Year: 2023).*

International Search Report and Written Opinion in PCT/US2022/081068, dated Apr. 18, 2023, 17 pages.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

T. Takai, H. Iwamoto, et al., "I.H.P.Saw Technology and its Application to Microacoustic Components (Invited)." 2017 IEEE International Ultrasonics Symposium, Sept. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

(56) References Cited

OTHER PUBLICATIONS

G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Webster Dictionary Meaning of "diaphragm" Merriam Webster since 1828.
Herrmann et al., "Properties of shear-horizontal surface acoustic waves in different layered quartz-SiO2 structures," Ultrasonics, 1999, vol. 37, pp. 335-341.
Chen et al., "Development and Application of SAW Filter," Micromachines, Apr. 20, 2022, vol. 13, No. 656, pp. 1-15.
Buchanan "Ceramit Materials for Electronics" 3rd Edition, first published in 2004 by Marcel Dekker, Inc. pp. 496 (Year 2004). Jan. 00, 2004.
Sorokin et al. "Study of Microwave Acoustic Attenuation in a Multi-frequency Bulk Acoustic Resonator Based on a Synthetic Diamond Single Crystal" Published in Acoustical Physics, vol. 61, No. 6, 2015 pp. 675 (Year 2015) Jan. 00, 2015.
Zou, Jie "High-Performance Aluminum Nitride Lamb Wave Resonators for RF Front-End Technology" University of California, Berkeley, Summer 2015, pp. 63 (Year 2015) Jan. 00, 2015.
Santosh, G., Surface acoustic wave devices on silicon using patterned and thin film ZnO, Ph.D. thesis, Feb. 2016, Indian Institute of technology Guwahati, Assam, India Feb. 2016.
Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
USPTO/ISA, International Search Report and Written Opinion for PCT Application No. PCT/US2020/45654 dated Oct. 29, 2020. 2020.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Gorisse et al., "Lateral Field Excitation of membrane-based Aluminum Nitride resonators", 2011 Joint Conference of the IEEE International Frequency Control and the European Frequency and Time Forum (FCS) Proceedings.
Pang et al., "Self-Aligned Lateral Field Excitation Film Acoustic Resonator with Very Large Electromechanical Coupling", 2004 IEEE International Ultrasonics, Ferroelectrics and Frequency Control Joint 50th Anniversary Conference, pp. 558-561.
Xue et al., "High Q Lateral-Field-Excited Bulk Resonator Based on Single-Crystal LiTaO3 for 5G Wireless Communication", Journal of Electron devices society, Mar. 2021, Introduction.
Yandrapalli et al., "Toward Band n78 Shear Bulk Acoustic Resonators Using Crystalline Y-Cut Lithium Niobate Films with Spurious Suppression", Journal of Microelectromechanical Systems, vol. 32, No. 4, Aug. 2023, pp. 327-334.
Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946.
Abass et al. "Effects of inhomogeneous grain size distribution in polycrystalline silicon solar cells", Energy Procedia 10(2011) pp. 55-60 @ 2011 Published by Elsevier Ltd.

* cited by examiner

WIDE BANDWIDTH TIME DIVISION DUPLEX TRANSCEIVER

RELATED APPLICATION INFORMATION

This patent is a continuation-in-part of application Ser. No. 16/829,617, filed Mar. 25, 2020, entitled HIGH POWER TRANSVERSLEY-EXCITED FILM BULK ACOUSTIC RESONATOR ON Z-CUT LITHIUM NIOBATE, which is a continuation of application Ser. No. 16/578,811, filed Sep. 23, 2019, entitled TRANSVERSELY-EXCITED FILM BULK ACOUSTIC RESONATORS FOR HIGH POWER APPLICATIONS, now U.S. Pat. No. 10,637,438, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
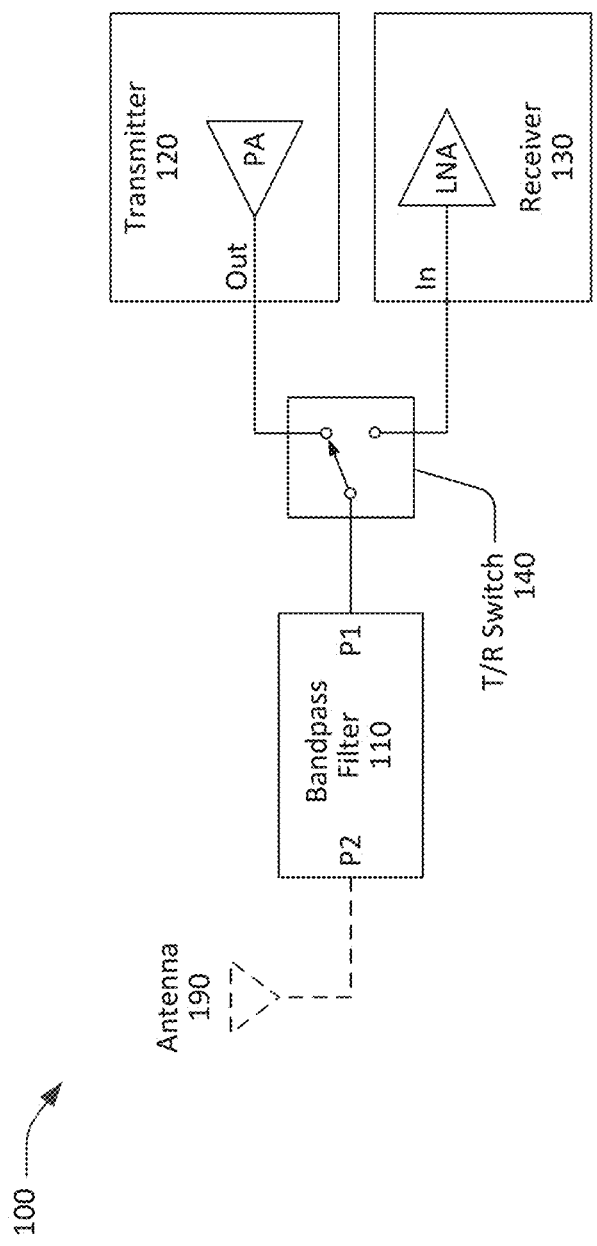
FIG. 1 is a block diagram of a broad band time division duplex transceiver.

FIG. 1 is a schematic block diagram of a wide bandwidth time division duplex (TDD) transceiver 100. The transceiver 100 includes a bandpass filter 110 having a first port P1 coupled to a transmit/receive (T/R) switch 140 a second port P2 configured for connection to an antenna 190. The antenna and the connection from the bandpass filter 110 to the antenna are not part of the transceiver 100 and are shown in dashed lines. The T/R switch 140 connects the second port of the bandpass filter 110 to either the output of a transmitter 120 or the input of a receiver 130. The T/R switch 140, the transmitter 120, and the receiver 130 are supervised by a processor (not shown) performing a media access control function.

The transceiver 100 is configured for operation in a designated communications band. The bandpass filter 110 has a pass band that encompasses the designated communications band and one or more stop bands to block designated frequencies outside of the designated communications band. Preferably, the bandpass filter 110 has low loss in its pass band and high rejection in its stop band(s). Further, the bandpass filter 110 must be compatible, which is to say stable and reliable, while passing the RF power generated by the transmitter 120.

The bandpass filter 110 may be implemented using transversely-excited film bulk acoustic resonators (XBARs). XBAR filters are particularly appropriate for TDD communications bands at frequencies above 3 GHz, including 5G NR bands n77 and n79, and 5 GHz and 6 GHz WiFi bands.

Figure 2:
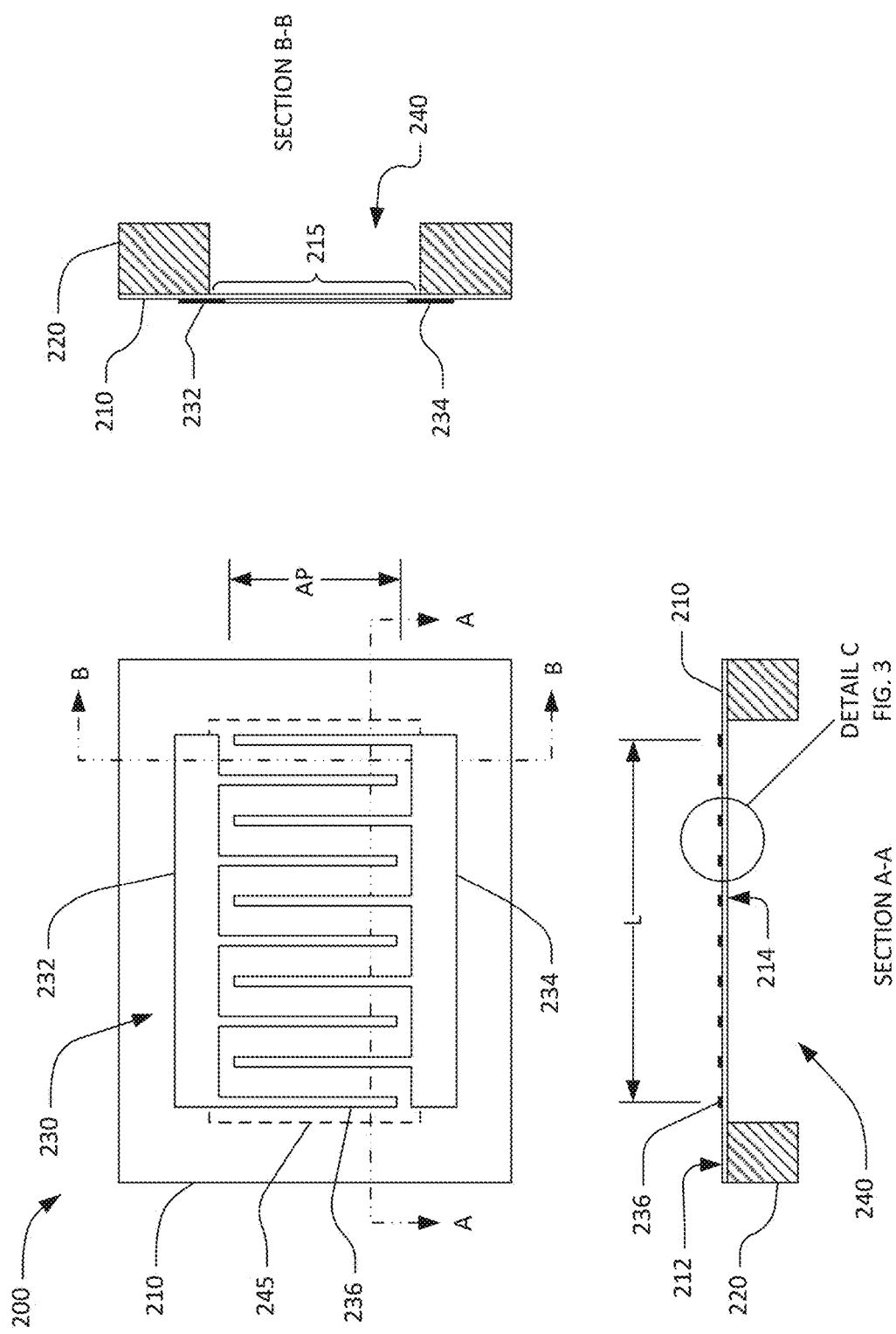
FIG. 2 includes a schematic plan view and two schematic cross-sectional views of a transversely-excited film bulk acoustic resonator (XBAR).

FIG. 2 shows a simplified schematic top view and orthogonal cross-sectional views of an XBAR 200. XBAR resonators such as the resonator 200 may be used in a variety of RF filters including band-reject filters, band-pass filters such as the bandpass filter 110, duplexers, and multiplexers.

The XBAR 200 is made up of a thin film conductor pattern formed on a surface of a piezoelectric plate 210 having parallel front and back surfaces 212, 214, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 212, 214. The piezoelectric plate may be rotated Z-cut or rotated YX-cut. XBARs may be fabricated on piezoelectric plates with other crystallographic orientations.

The back surface 214 of the piezoelectric plate 210 is attached to a surface of the substrate 220 except for a portion of the piezoelectric plate 210 that forms a diaphragm 215 spanning a cavity 240 formed in the substrate. The portion of the piezoelectric plate that spans the cavity is referred to herein as the "diaphragm" 215 due to its physical resemblance to the diaphragm of a microphone. As shown in FIG. 2, the diaphragm 215 is contiguous with the rest of the piezoelectric plate 210 around all of a perimeter 245 of the cavity 240. In this context, "contiguous" means "continuously connected without any intervening item". In other configurations, the diaphragm 215 may be contiguous with the piezoelectric plate are at least 50% of the perimeter 245 of the cavity 240.

The substrate 220 provides mechanical support to the piezoelectric plate 210. The substrate 220 may be, for example, silicon, sapphire, quartz, or some other material or combination of materials. The back surface 214 of the piezoelectric plate 210 may be bonded to the substrate 220 using a wafer bonding process. Alternatively, the piezoelectric plate 210 may be grown on the substrate 220 or attached to the substrate in some other manner. The piezoelectric plate 210 may be attached directly to the substrate or may be attached to the substrate 220 via one or more intermediate material layers (not shown in FIG. 2).

"Cavity" has its conventional meaning of "an empty space within a solid body." The cavity 240 may be a hole completely through the substrate 220 (as shown in Section A-A and Section B-B) or a recess in the substrate 220 under the diaphragm 215. The cavity 240 may be formed, for example, by selective etching of the substrate 220 before or after the piezoelectric plate 210 and the substrate 220 are attached.

The conductor pattern of the XBAR 200 includes an interdigital transducer (IDT) 230. The IDT 230 includes a first plurality of parallel fingers, such as finger 236, extending from a first busbar 232 and a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT.

The first and second busbars 232, 234 serve as the terminals of the XBAR 200. A radio frequency or microwave signal applied between the two busbars 232, 234 of the IDT 230 excites a primary acoustic mode within the piezoelectric plate 210. The primary acoustic mode is a bulk shear mode where acoustic energy propagates along a direction substantially orthogonal to the surface of the piezoelectric plate 210, which is also normal, or transverse, to the direction of the electric field created by the IDT fingers. Thus, the XBAR is considered a transversely-excited film bulk wave resonator.

The IDT 230 is positioned on the piezoelectric plate 210 such that at least the fingers of the IDT 230 are disposed on the diaphragm 215 that spans, or is suspended over, the cavity 240. As shown in FIG. 2, the cavity 240 has a rectangular shape with an extent greater than the aperture AP and length L of the IDT 230. A cavity of an XBAR may have a different shape, such as a regular or irregular polygon. The cavity of an XBAR may more or fewer than four sides, which may be straight or curved.

For ease of presentation in FIG. 2, the geometric pitch and width of the IDT fingers is greatly exaggerated with respect to the length (dimension L) and aperture (dimension AP) of the XBAR. A typical XBAR has more than ten parallel fingers in the IDT 210. An XBAR may have hundreds, possibly thousands, of parallel fingers in the IDT 210. Similarly, the thicknesses of the IDT fingers and the piezoelectric plate in the cross-sectional views are greatly exaggerated.

Figure 3:
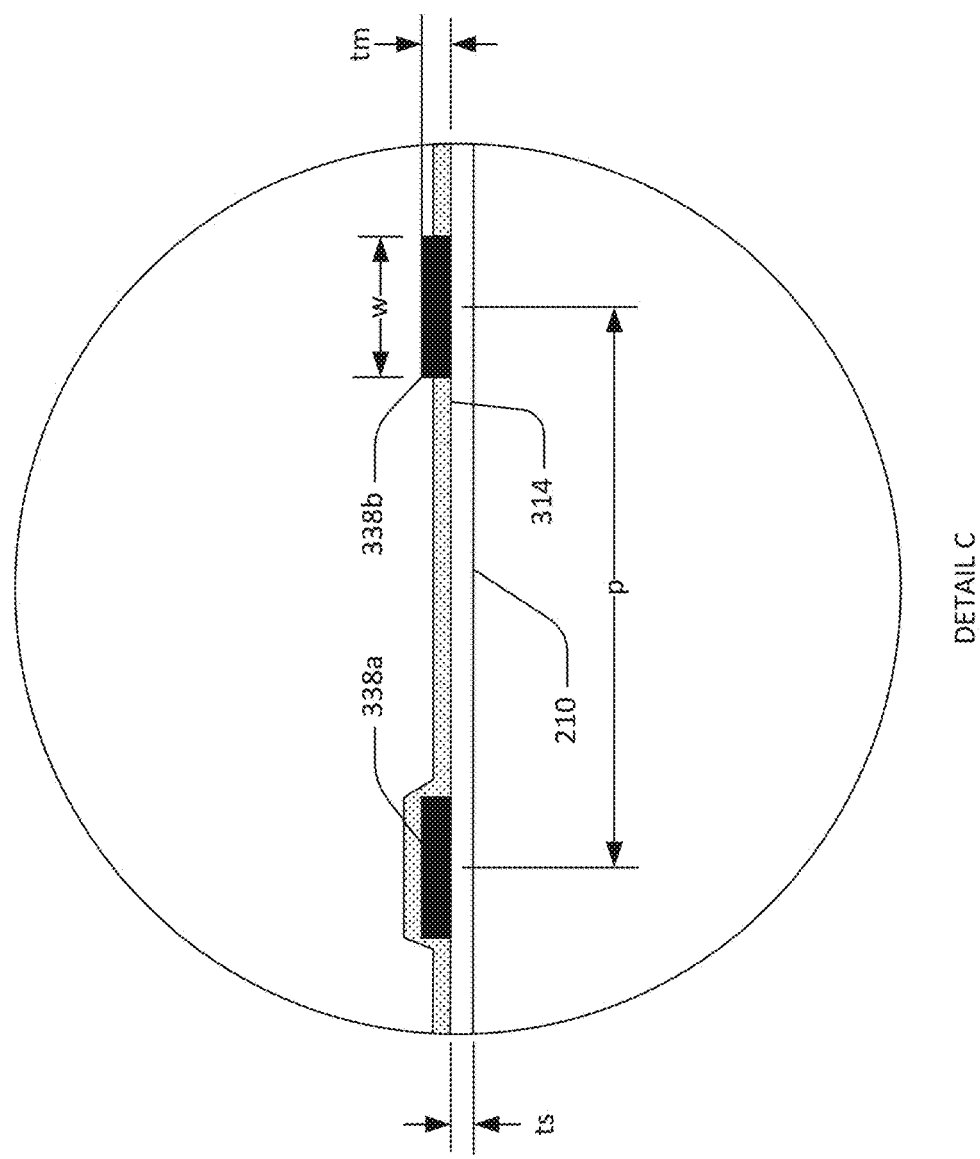
FIG. 3 is an expanded schematic cross-sectional view of a portion of the XBAR of FIG. 3.

FIG. 3 shows a detailed schematic cross-sectional view of the XBAR 200. The piezoelectric plate 210 is a single-crystal layer of piezoelectrical material having a thickness ts. ts may be, for example, 100 nm to 1500 nm. When used in filters for communications bands from 3.4 GHZ to 6 GHz, the thickness ts may be, for example, 200 nm to 1000 nm.

A front-side dielectric layer 314 may optionally be formed on the front side of the piezoelectric plate 210. The "front side" of the XBAR is, by definition, the surface facing away from the substrate. The front-side dielectric layer 314 may be formed only between the IDT fingers (e.g. IDT finger 338b) or may be deposited as a blanket layer such that the dielectric layer is formed both between and over the IDT fingers (e.g. IDT finger 338a). The front-side dielectric layer 314 may be a non-piezoelectric dielectric material, such as silicon dioxide, alumina, or silicon nitride. tfd may be, for example, 0 to 500 nm. tfd is typically less than about one-third of the thickness is of the piezoelectric plate. The front-side dielectric layer 314 may be formed of multiple layers of two or more materials. In some applications, a back-side dielectric layer (not shown) may be formed on the back side of the piezoelectric plate 210.

The IDT fingers 338a, 338b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 210 and/or to passivate or encapsulate the fingers and/or to improve power handling. The busbars (232, 234 in FIG. 2) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 210. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (232, 234 in FIG. 2) of the IDT may be the same as, or greater than, the thickness tm of the IDT fingers.

Figure 4:
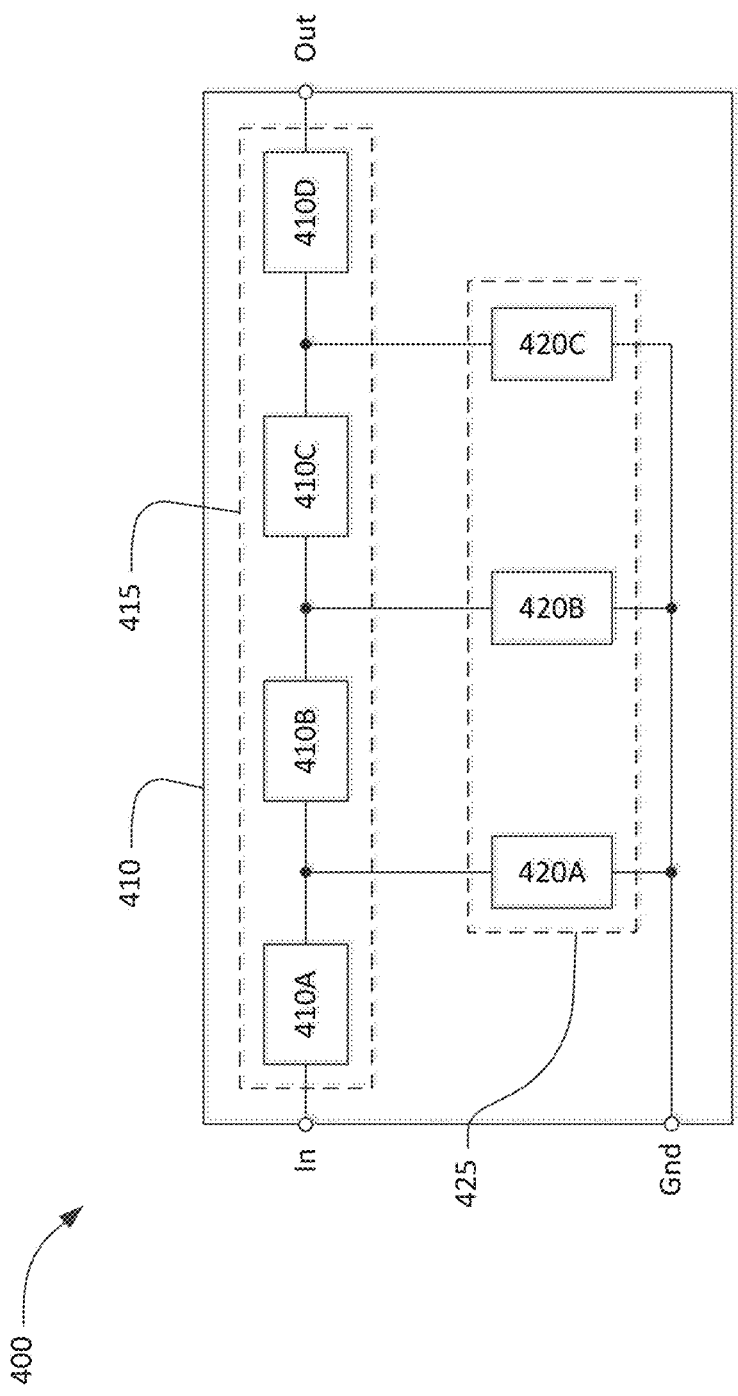
FIG. 4 is a schematic circuit diagram of a band-pass filter using acoustic resonators in a ladder filter circuit.

FIG. 4 is a schematic circuit diagram for a high frequency band-pass filter 400 using XBARs. The filter 400 has a conventional ladder filter architecture including four series resonators 410A, 410B, 410C, 410D and three shunt resonators 420A, 420B, 420C. The four series resonators 410A, 410B, 410C, and 410D are connected in series between a first port and a second port. In FIG. 4, the first and second ports are labeled "In" and "Out", respectively. However, the filter 400 is symmetrical and either port and serve as the input or output of the filter. The three shunt resonators 420A, 420B, 420C are connected from nodes between the series resonators to ground. All the shunt resonators and series resonators are XBARs. Although not shown in FIG. 4, none, some, or all of the resonators may be divided into multiple sub-resonators electrically connected in parallel. Each sub-resonator may have a respective diaphragm.

In a ladder filter, such as the filter 400, the resonance frequencies of shunt resonators are typically lower than the resonance frequencies of series resonators. The resonance frequency of an SM XBAR resonator is determined, in part, by IDT pitch. IDT pitch also impacts other filter parameters including impedance and power handling capability. For broad-band filter applications, it may not be practical to provide the required difference between the resonance frequencies of shunt and series resonators using only differences in IDT pitch.

As described in U.S. Pat. No. 10,601,392, a first dielectric layer (represented by the dashed rectangle 425) having a first thickness t1 may be deposited over the IDTs of some or all of the shunt resonators 420A, 420B, 420C. A second dielectric layer (represented by the dashed rectangle 415) having a second thickness t2, less than t1, may be deposited over the IDTs of the series resonators 410A, 410B, 410C, 410D. The second dielectric layer may be deposited over both the shunt and series resonators. The difference between the thickness t1 and the thickness t2 defines a frequency offset between the series and shunt resonators. Individual series or shunt resonators may be tuned to different frequencies by varying the pitch of the respective IDTs. In some filters, more than two dielectric layers of different thicknesses may be used as described in co-pending application Ser. No. 16/924,108.

Alternatively or additionally, the shunt resonators 410A, 410B, 410C, 410D may be formed on a piezoelectric plate having a thickness t3 and the series resonators 420A, 420B, 420C may be fabricated on a piezoelectric plate having a thickness t4 less than t3. The difference between the thicknesses t3 and t4 defines a frequency offset between the series and shunt resonators. Individual series or shunt resonators may be tuned to different frequencies by varying the pitch of the respective IDTs. In some filters, three or more different piezoelectric plate thicknesses may be used to provide additional frequency tuning capability.

The filter 400 is exemplary. A bandpass filter may have more or fewer than seven resonators, more or fewer than four series resonators, and nor or fewer than three shunt resonators. Most filters will have at least three resonators including at least on shunt resonator and one series resonator. Filters may include additional reactive components, such as inductors and/or capacitors that are not shown in FIG. 4.

Figure 5A:
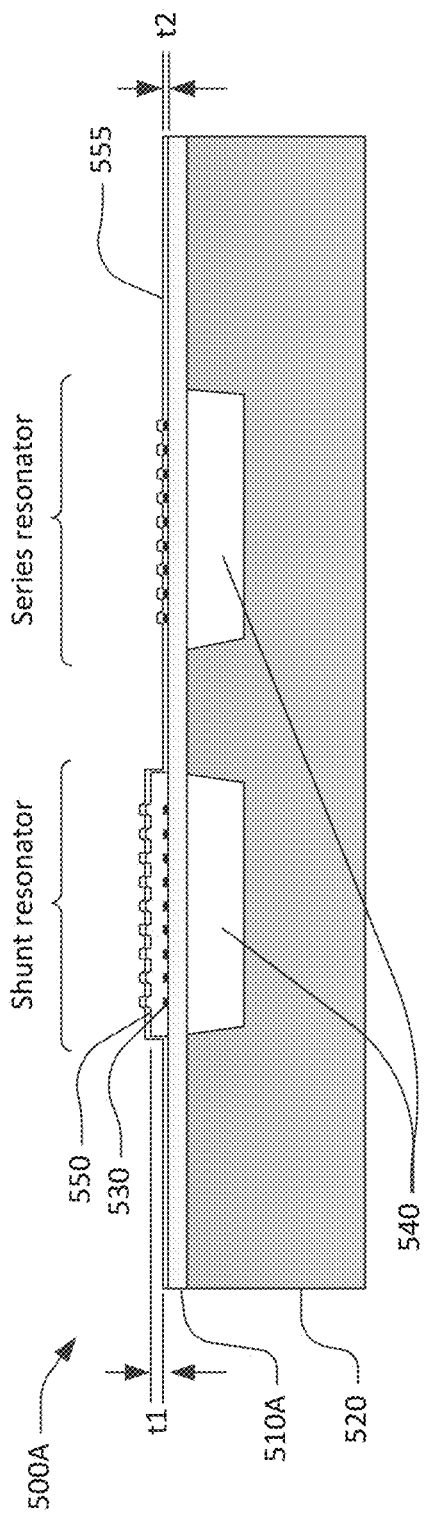
FIG. 5A is a schematic cross-sectional view of a filter with a dielectric frequency setting layer to set a frequency separation between shunt resonators and series resonators.

FIG. 5A is a schematic cross-sectional view though a shunt resonator and a series resonator of a filter 500A that uses dielectric thickness to separate the frequencies of shunt and series resonators. A piezoelectric plate 510A is attached to a substrate 520. Portions of the piezoelectric plate form diaphragms spanning cavities 540 in the substrate 520. Interleaved IDT fingers, such as finger 530, are formed on the diaphragms. A first dielectric layer 550, having a thickness t1, is formed over the IDT of the shunt resonator. A second dielectric layer 555, having a thickness t2, is deposited over both the shunt and series resonators. Alternatively, a single dielectric layer having thickness t1+t2 may be deposited over both the shunt and series resonators. The dielectric layer over the series resonator may then be thinned to thickness t2 using a masked dry etching process. In either case, the difference between the overall thickness of the dielectric layers (t1+t2) over the shunt resonator and the thickness t2 of the second dielectric layer defines a frequency offset between the series and shunt resonators.

The second dielectric layer 555 may also serve to seal and passivate the surface of the filter 500A. The second dielectric layer may be the same material as the first dielectric layer or a different material. The second dielectric layer may be a laminate of two or more sub-layers of different materials. Alternatively, an additional dielectric passivation layer (not shown in FIG. 5A) may be formed over the surface of the filter 500A. Further, the thickness of the final dielectric layer (i.e. either the second dielectric layer 555 or an additional dielectric layer) may be locally adjusted to fine-tune the frequency of the filter 500A. When local tuning is performed, the final dielectric layer can be referred to as the "passivation and tuning layer".

Figure 5B:
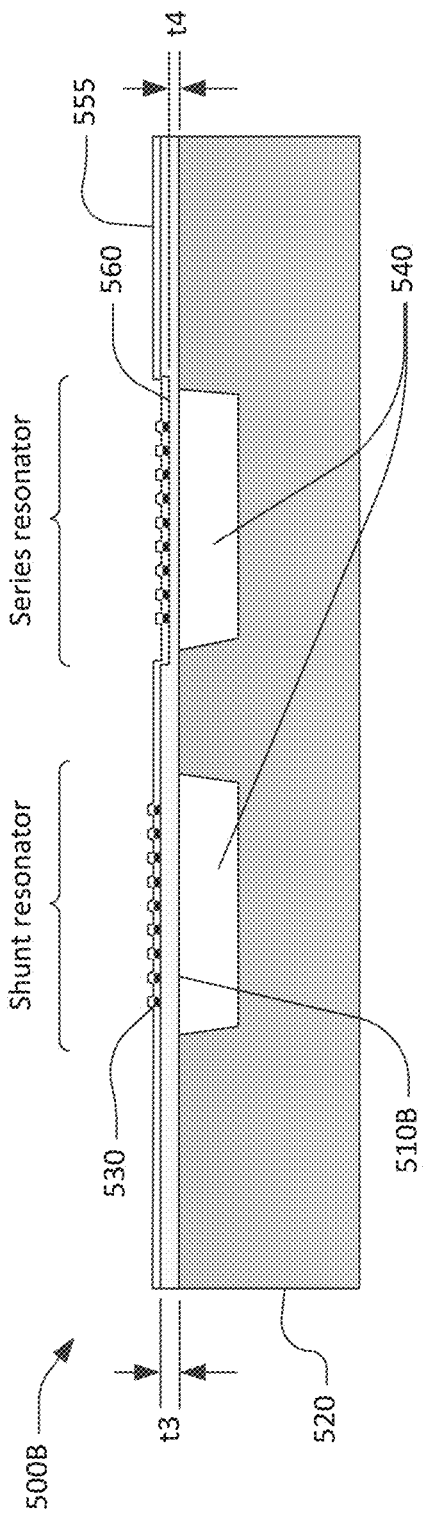
FIG. 5B is a schematic cross-sectional view of a filter with different piezoelectric diaphragm thicknesses to set a frequency separation between shunt resonators and series resonators.

FIG. 5B is a schematic cross-sectional view though a shunt resonator and a series resonator of a filter 500B that uses piezoelectric plate thickness to separate the frequencies of shunt and series resonators. A piezoelectric plate 510B is attached to a substrate 520. Portions of the piezoelectric plate form diaphragms spanning cavities 540 in the substrate 520. Interleaved IDT fingers, such as finger 530, are formed on the diaphragms. The diaphragm of the shunt resonator has a thickness t3. The piezoelectric plate 510B is selectively thinned such that the diaphragm of the series resonator has a thickness t4, which is less than t3. The difference between t3 and t4 defines a frequency offset between the series and shunt resonators. A passivation and tuning layer 555 may be deposited over both the shunt and series resonators.

The piezoelectric plate and IDT of an XBAR are configured such that a radio frequency (RF) signal applied across the IDT (i.e. between the first and second busbars of the IDT) excites a shear primary acoustic mode in the diaphragm. The RF signal may also excite undesired or spurious acoustic modes. The spurious acoustic modes may include, for example, harmonics of the shear primary acoustic mode and/or plate waves that travel across the diaphragm in directions normal to or parallel to the IDT fingers. The presence or absence of spurious modes and the frequencies and amplitudes of such modes depend on various parameters including diaphragm thickness ts, IDT metal thickness tm, IDT pitch p and IDT finger width w.

Given the complexity of the relationships between spurious modes and XBAR design, the inventors undertook an empirical evaluation, using two-dimensional finite element modeling, of a large number of hypothetical XBAR resonators. For each combination of diaphragm thickness ts, IDT finger thickness tm, and IDT pitch p, the XBAR resonator was simulated for a sequence of IDT finger width w values. A figure of merit (FOM) was calculated for each value if w to estimate the negative impact of spurious modes. The FOM is calculated by integrating the negative impact of spurious modes across a defined frequency range. The FOM and the frequency range depend on the requirements of a particular filter. The frequency range typically includes the passband of the filter and may include one or more stop bands. Spurious modes occurring between the resonance and anti-resonance frequencies of each hypothetical resonator were given a heavier weight in the FOM than spurious modes at frequencies below resonance or above anti-resonance. Hypothetical resonators having a minimized FOM below a threshold value were considered potentially "useable", which is to say probably having sufficiently low spurious modes for use in a filter. Hypothetical resonators having a minimized FOM above the threshold value were considered not useable.

Based on this analysis, U.S. Pat. No. 10,637,811, entitled TRANSVERSELY-EXCITED FILM BULK ACOUSTIC RESONATORS FOR HIGH POWER APPLICATIONS, defines XBAR parameter ranges usable in high power filters. These ranges are summarized in Table 1.

TABLE 1

XBAR PARAMETERS FOR HIGH POWER APPLICATIONS

| XBAR Configuration | IDT Finger Thickness tm |
|---|---|
| Substantially aluminum IDT fingers; No dielectric frequency setting layer | $0.85\ ts \leq tm \leq 2.5\ ts$ |
| Substantially aluminum IDT fingers; With dielectric frequency setting layer | $0.875\ ts \leq tm \leq 2.25\ ts$ |
| Substantially copper IDT fingers; No dielectric frequency setting layer | $0.85\ ts \leq tm \leq 1.42\ ts$ OR $1.95\ ts \leq tm \leq 2.325\ ts$ |
| Substantially copper IDT fingers; With dielectric frequency setting layer | $0.85\ ts \leq tm \leq 1.42\ ts$ |

The data in Table 1 is for a dielectric frequency setting layer having a thickness less than or equal to 0.25 times a thickness of the piezoelectric plate. In some cases, a dielectric frequency setting layer may be as thick as 0.35 times the thickness of the piezoelectric plate.

XBAR devices within one of the four configurations defined in Table 1 will be referred to herein as "high power XBARs". Filters implemented with high power XBARs are suitable for use in TDD transceivers. For example, the filter 110 in the transceiver 100 of FIG. 1 may be implemented with a plurality of high power XBARs.

Figure 6:
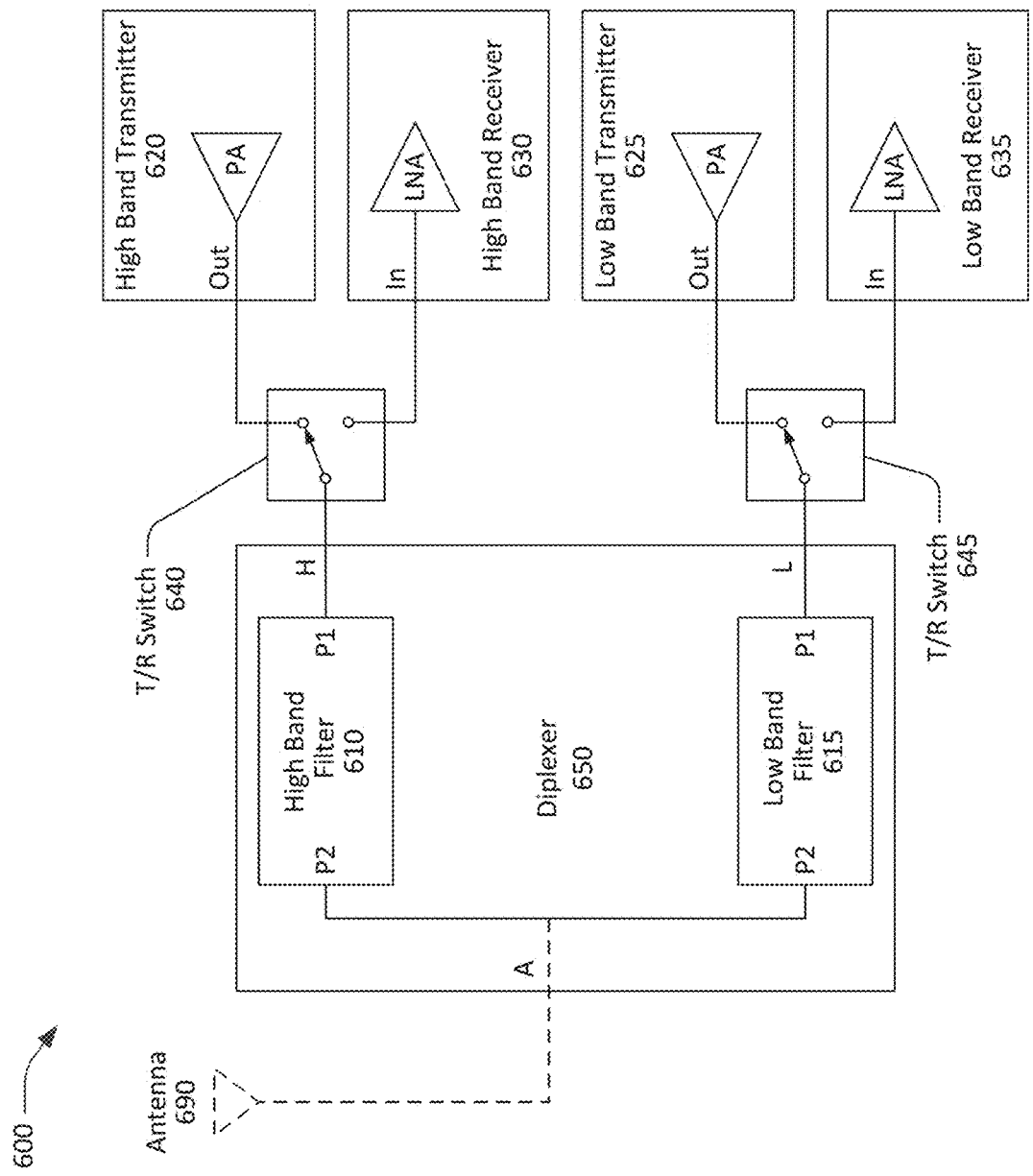
FIG. 6 is a block diagram of a dual-band time division duplex transceiver.

FIG. 6 is a schematic block diagram of a dual band TDD transceiver 600. The transceiver 600 includes a high band filter 610 and a low band filter 615 connected to form a diplexer 650. The diplexer 650 has a high band port H coupled to a first port P1 of the high band filter 610, a low band port L coupled to a first port P1 of the low band filter 615, and a common or antenna port A coupled to second ports P2 of both filters. The function of the diplexer 650 is to permit two transceivers with different frequency bands to share a common antenna. The antenna port A of the diplexer 650 is configured to connect to an antenna 690. The antenna 690 and the connection from the antenna port A of the diplexer 650 to the antenna are not part of the transceiver 600 and are shown in dashed lines. The terms "high band" and "low band" refer to the frequency range of each band and are relative. For example, the high band may be 5G NR band n79 and the low band may be 5G NR band n77.

A high band T/R switch 640 connects the high band port H of the diplexer 650 to either the output of a high band transmitter 620 or the input of a high band receiver 630. A low band T/R switch 645 connects the low band port L of the diplexer 650 to either the output of a low band transmitter 625 or the input of a low band receiver 635. The T/R switches 640/645, the transmitters 620/625, and the receivers 630/635 are supervised by a processor (not shown) performing a media access control function.

The high band filter 610 and the low band filter 615 may be implemented using high power XBARs. The diplexer 650 may be implemented as a single chip device with all the XBARs sharing a single piezoelectric plate and substrate. The diplexer 650 may be implemented as two or more chips contained within a common package.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A wide bandwidth time division duplex (TDD) transceiver comprising:
   a transmitter;
   a receiver;
   a bandpass filter comprising a plurality of acoustic resonators including at least one shunt resonator and at least one series resonator; and
   a transmit/receive switch configured to selectively connect a first port of the bandpass filter to either an output of the transmitter or an input of the receiver,
   wherein each of the plurality of acoustic resonators is a transversely-excited film bulk acoustic resonator,
   wherein each of the plurality of acoustic resonators comprises:
   a piezoelectric layer, and
   an interdigital transducer (IDT) with interleaved fingers on a surface of the piezoelectric layer, a thickness of the interleaved fingers of the IDT being greater than or equal to 0.85 times a thickness of the piezoelectric layer and less than or equal to 2.5 times the thickness of the piezoelectric layer.

2. A diplexer for a dual channel time division duplex (TDD) transceiver comprising:
   a low band bandpass filter comprising a first port, a second port, and a first plurality of acoustic resonators; and
   a high band bandpass filter comprising a first port, a second port, and a second plurality of acoustic resonators,
   wherein each acoustic resonator of the first and second pluralities of acoustic resonators is a transversely-excited film bulk acoustic resonators, and
   the second port of the low band bandpass filter and the second port of the high band bandpass filter are connected to a common port configured for connection to an antenna,
   wherein each acoustic resonators comprises:
   a piezoelectric layer, and
   an interdigital transducer (IDT) with interleaved fingers on a surface of the piezoelectric layer, a thickness of the interleaved fingers of the IDT being greater than or equal to 0.85 times a thickness of the piezoelectric layer and less than or equal to 2.5 times the thickness of the piezoelectric layer.

3. The TDD transceiver of claim 1, wherein, for each of the plurality of acoustic resonators, the piezoelectric layer and the IDT are configured such that a respective radio frequency signal applied to the IDT excites a respective primary shear acoustic mode in the piezoelectric layer.

4. The TDD transceiver of claim 1, wherein the interleaved fingers of the IDT of each of the plurality of acoustic resonators are substantially aluminum.

5. The TDD transceiver of claim 4, wherein:
   the at least one shunt resonator further comprises a dielectric frequency setting layer having a thickness greater than zero and less than or equal to 0.25 times the thickness of the piezoelectric layer, and
   the thickness of the interleaved fingers of the IDTs of the at least one shunt resonator is greater than or equal to 0.875 times the thickness of the piezoelectric layer and less than or equal to 2.25 times the thickness of the piezoelectric layer.

6. The TDD transceiver of claim 1 wherein:
   the interleaved fingers of the IDT of each of the plurality of acoustic resonators are substantially copper, and the thickness of the interleaved fingers of the IDT of each of the plurality of acoustic resonators is within a first range of greater than or equal to 0.85 times the thickness of the piezoelectric layer and less than or equal to 1.42 times the thickness of the piezoelectric layer, or within a second range of greater than or equal to 1.95 times the thickness of the piezoelectric layer and less than or equal to 2.325 times the thickness of the piezoelectric layer.

7. The TDD transceiver of claim 6, wherein:
the at least one shunt resonator further comprises a dielectric frequency setting layer having a thickness greater than zero and less than or equal to 0.25 times the thickness of the piezoelectric layer, and
the thickness of the interleaved fingers of the IDTs of the at least one shunt resonator is within the first range of greater than or equal to 0.85 times the thickness of the piezoelectric layer and less than or equal to 1.42 times the thickness of the piezoelectric layer.

8. The TDD transceiver of claim 1, wherein a second port of the bandpass filter is configured to connect to an antenna.

9. A wide bandwidth time division duplex (TDD) transceiver comprising:
a transmitter;
a receiver;
a bandpass filter; and
a transmit/receive switch configured to selectively connect a first port of the bandpass filter to either an output of the transmitter or an input of the receiver,
wherein the bandpass filter further comprises a plurality of acoustic resonators including one or more shunt resonators and one or more series resonators that each comprise:
a substrate;
a piezoelectric layer having front and back surfaces, the back surface attached to a surface of the substrate either directly or via one or more intermediate layers, portions of the piezoelectric layer forming one or more diaphragms spanning respective cavities in at least one of the substrate and the one or more intermediate layers; and
a conductor pattern on the piezoelectric layer and including an interdigital transducer (IDT) having interleaved fingers disposed on the diaphragm;
wherein the interleaved fingers of the IDT are substantially aluminum, and a thickness of the interleaved fingers of the IDT is greater than or equal to 0.85 times a thickness of the piezoelectric layer and less than or equal to 2.5 times the thickness of the piezoelectric plate.

10. The diplexer of claim 2, wherein the piezoelectric layer and the IDT of each acoustic resonator of the first and second pluralities of acoustic resonators are configured such that a respective radio frequency signal applied to the IDT excites a respective primary shear acoustic mode in the piezoelectric layer.

11. The TDD transceiver of claim 9 wherein:
the at least one shunt resonator further comprises a dielectric frequency setting layer having a thickness greater than zero and less than or equal to 0.25 times the thickness of the piezoelectric layer, and
the thickness of the interleaved fingers of the IDT of each of the plurality of acoustic resonators is greater than or equal to 0.875 times the thickness of the piezoelectric layer and less than or equal to 2.25 times the thickness of the piezoelectric layer.

12. The TDD transceiver of claim 9, wherein:
the interleaved fingers of the IDT of each of the plurality of acoustic resonators are substantially copper, and
the thickness of the interleaved fingers of the IDT of each of the plurality of acoustic resonators is within a first range of greater than or equal to 0.85 times the thickness of the piezoelectric layer and less than or equal to 1.42 times the thickness of the piezoelectric layer, or with a second range of greater than or equal to 1.95 times the thickness of the piezoelectric layer and less than or equal to 2.325 times the thickness of the piezoelectric layer.

13. The TDD transceiver of claim 12, wherein:
the at least one shunt resonator further comprises a dielectric frequency setting layer having a thickness greater than zero and less than or equal to 0.25 times the thickness of the piezoelectric layer, and
the thickness of the interleaved fingers of the IDT of each of the plurality of acoustic resonators is with the first range of greater than or equal to 0.85 times the thickness of the piezoelectric layer and less than or equal to 1.42 times the thickness of the piezoelectric layer.

14. The TDD transceiver of claim 9, wherein, for each of the plurality of acoustic resonators, the piezoelectric layer and the IDT are configured such that a respective radio frequency signal applied to the IDT excites a respective primary shear acoustic mode in the respective diaphragm.

15. The TDD transceiver of claim 9, wherein a second port of the bandpass filter is configured to connect to an antenna.

16. The TDD transceiver of claim 9, wherein each of the plurality of acoustic resonators is a transversely-excited film bulk acoustic resonator.

* * * * *